(12) United States Patent
Hwang et al.

(10) Patent No.: US 8,780,567 B2
(45) Date of Patent: Jul. 15, 2014

(54) CONDUCTIVE SUBSTRATE AND ELECTRONIC DEVICE COMPRISING SAME

(71) Applicant: LG Chem, Ltd., Seoul (KR)

(72) Inventors: Ji Young Hwang, Daejeon (KR); In-Seok Hwang, Daejeon (KR); Yong Goo Son, Daejeon (KR); Beom Mo Koo, Daejeon (KR); Jiehyun Seong, Daejeon (KR); Joo Yeon Kim, Daejeon (KR); Jeseob Park, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/973,205

(22) Filed: Aug. 22, 2013

(65) Prior Publication Data

US 2013/0343010 A1  Dec. 26, 2013

Related U.S. Application Data

(63) Continuation of application No. PCT/KR2012/011398, filed on Dec. 24, 2012.

(30) Foreign Application Priority Data

Dec. 23, 2011  (KR) .................. 10-2011-0141747

(51) Int. Cl.
*H05K 1/11* (2006.01)
*H05K 1/14* (2006.01)
*G06F 3/045* (2006.01)

(52) U.S. Cl.
USPC .......................................... 361/748; 345/174

(58) Field of Classification Search
USPC ............ 361/748; 345/173–175, 104; 178/18.01–18.08, 18.11; 349/12; 257/59, 72, 84; 438/22–47
See application file for complete search history.

(56) References Cited

U.S. PATENT DOCUMENTS

2011/0096018 A1*  4/2011  Lee et al. ............. 345/174

FOREIGN PATENT DOCUMENTS

| | | |
|---|---|---|
| JP | 2004-279473 A | 10/2004 |
| KR | 10-2009-0048610 A | 5/2009 |
| KR | 10-2009-0051007 A | 5/2009 |
| KR | 10-2011-0007593 A | 1/2011 |
| KR | 10-2011-0127101 A | 11/2011 |

* cited by examiner

*Primary Examiner* — Jenny L Wagner
*Assistant Examiner* — Michael P McFadden
(74) *Attorney, Agent, or Firm* — McKenna Long & Adridge LLP

(57) ABSTRACT

Disclosed are an electric conducting substrate, comprising a transparent substrate and an electric conducting pattern comprising an electric conducting line provided on the transparent substrate, and an electronic device comprising the same.

30 Claims, 12 Drawing Sheets

CONDUCTIVE SUBSTRATE AND ELECTRONIC DEVICE COMPRISING SAME

This application is a bypass continuation application of International Application No. PCT/KR2012/011398, filed Dec. 24, 2012, which claims priority to Korean Patent Application No. 10-2011-0141747, filed on Dec. 23, 2011 in the Korean Intellectual Property Office, both of which are incorporated herein by reference.

TECHNICAL FIELD

The present invention relates to an electric conducting substrate and an electronic device comprising the same. In particular, the present invention relates to an electric conducting substrate having excellent electric conductivity and not obstructing a view and an electronic device comprising the same.

BACKGROUND ART

Recently, as distribution of smart phones, and tablet PCs, IPTVs, and the like has accelerated, requirement for a touch function in which a hand of human directly becomes an input device without requiring a separate input device such as a keyboard or a remote controller has gradually increased. Further, a writable multi-touch function has been additionally required in addition to a specific point touch function.

A touch panel having the functions may be classified as follows according to a signal detecting method.

That is, the touch panels are divided into a resistive type detecting a position pressed by a pressure through a change in a current or voltage value in a state where DC voltage is applied, a capacitive type using capacitance coupling in a state where AC voltage is applied, and an electromagnetic type detecting a selected position as a change in voltage in a state where a magnetic field is applied.

Among the types, the most common resistive type and capacitive type touch panels recognize a touch or not according to an electrical touch or a change of capacitance by using a transparent conductive film such as an ITO film. However, most of the transparent conductive films have high resistance of 150 ohm/square or more, and sensitivity when increasing a size deteriorates. In addition, as a size of a screen is increased, costs of the ITO film rapidly increase, and as a result, commercialization is not easy. In order to solve the problem, an attempt to implement a large size by using a metal pattern having high electric conductivity is being made. However, in the case of the metal pattern having high electric conductivity, there is a problem in that a view is obstructed.

DETAILED DESCRIPTION OF THE INVENTION

Technical Problem

As described above, the present invention is accomplished after researches of a solution for preventing a view from being obstructed when configuring an electric conducting substrate using a metal pattern are repetitively conducted.

Technical Solution

An exemplary embodiment of the present invention provides an electric conducting substrate, comprising:

a transparent substrate and an electric conducting pattern comprising an electric conducting line provided on the transparent substrate, in which the electric conducting pattern comprises cells closed by the electric conducting line, a 0.5-squared value of an area of the cell is defined as a characteristic length (Lc) of the cells, and when a graph 1 representing the following Formula 1 and a graph 2 representing the following Formula 2 are illustrated by setting an average of characteristic lengths ($Lc_{av}$) of the cells as an X axis and setting a line width (W) of the electric conducting line as a Y axis, the line width (W) of the electric conducting line and the average of characteristic lengths ($Lc_{av}$) of the cells are comprised in a crossing region of a lower region of the graph 1 and a lower region of the graph 2:

$$W=[(1/AR^{0.5})-1]Lc_{av} \quad \text{[Formula 1]}$$

$$W=13\exp(-0.0052 Lc_{av})+\alpha \quad \text{[Formula 2]}$$

in Formulas 1 and 2,

W is a line width of the electric conducting line, and $Lc_{av}$ is an average of characteristic lengths of cells closed by the electric conducting line, AR is an aperture ratio of the electric conducting pattern, and α is a constant.

Another exemplary embodiment of the present invention provides an electric conducting substrate, comprising:

a transparent substrate and an electric conducting pattern comprising an electric conducting line provided on the transparent substrate, in which the electric conducting pattern comprises cells closed by the electric conducting line, a characteristic length (Lc) of the cells defined by a 0.5-squared value of an area of the cell satisfies the following Formula 3:

$$Y_1/n \leq Lc \leq 2Y_2 \quad \text{[Formula 3]}$$

in Formula 3, n is the number of subpixels arranged in one direction in each pixel of the display to which the electric conducting substrate is applied, and $Y_1$ and $Y_2$ are represented by the following formulas, respectively.

$$Y_1=(2.9Q+68.1)\times 1 \text{ μm/1 inch}$$

$$Y2=(13.3Q+98.1)\times 1 \text{ μm/1 inch}$$

in the formulas, Q is a diagonal length (inch) of an effective screen part of the display to which the electric conducting substrate is applied.

Another exemplary embodiment of the present invention provides an electric conducting substrate, comprising:

a transparent substrate and an electric conducting pattern comprising an electric conducting line provided on the transparent substrate, in which the electric conducting pattern comprises cells closed by the electric conducting line, a characteristic length (Lc) of the cells defined by a 0.5-squared value of an area of the cell satisfies the following Formula 4:

$$Lp/n \leq Lc \leq 2Lp \quad \text{[Formula 4]}$$

in Formula 4, n is the number of subpixels arranged in one direction in each pixel of the display to which the electric conducting substrate is applied, and Lp is a characteristic length of the pixel defined by a 0.5-squared value of an area of each pixel of the display to which the electric conducting substrate is applied.

Another exemplary embodiment of the present invention provides an electric conducting substrate, comprising:

a transparent substrate and an electric conducting pattern comprising an electric conducting line provided on the transparent substrate, in which a line width (W) of the electric conducting line satisfies the following Formula 6:

$$0.03Y_3 \geq W \qquad [\text{Formula 6}]$$

in Formula 6,

W is a line width of the electric conducting line, and $Y_3$ is a real number within a range of $Y_1 \leq Y_3 \leq Y_2$, and here, $Y_1$ and $Y_2$ are represented by the following formulas, respectively.

$$Y_1 = (2.9Q + 68.1) \times 1\ \mu m/1\ \text{inch}$$

$$Y_2 = (13.3Q + 98.1) \times 1\ \mu m/1\ \text{inch}$$

in the formulas, Q is a diagonal length (inch) of an effective screen part of the display to which the electric conducting substrate is applied.

Another exemplary embodiment of the present invention provides an electric conducting substrate, comprising:

a transparent substrate and an electric conducting pattern comprising an electric conducting line provided on the transparent substrate, in which a line width (W) of the electric conducting line satisfies the following Formula 7:

$$0.03 Lp \geq W \qquad [\text{Formula 7}]$$

in Formula 7,

W is a line width of the electric conducting line, and

Lp is a characteristic length of the pixel defined by a 0.5-squared value of an area of each pixel of the display to which the electric conducting substrate is applied.

Another exemplary embodiment of the present invention provides an electric conducting substrate, comprising:

a transparent substrate and an electric conducting pattern comprising an electric conducting line provided on the transparent substrate, in which a line width (W) of the electric conducting line satisfies the following Formula 9:

$$3Y_3/(100 \times 10^{1/2}) \geq W \qquad [\text{Formula 9}]$$

in Formula 9,

W is a line width of the electric conducting line, and $Y_3$ is a real number ($\mu m$) within a range of $Y_1 \leq Y_3 \leq Y_2$, and here, $Y_1$ and $Y_2$ are represented by the following formulas, respectively.

$$Y_1 = (2.9Q + 68.1) \times 1\ \mu m/1\ \text{inch}$$

$$Y_2 = (13.3Q + 98.1) \times 1\ \mu m/1\ \text{inch}$$

in the formulas, Q is a diagonal length (inch) of an effective screen part of the display to which the electric conducting substrate is applied.

Further, another exemplary embodiment of the present invention provides an electric conducting substrate, comprising:

a transparent substrate and an electric conducting pattern comprising an electric conducting line provided on the transparent substrate, in which a line width (W) of the electric conducting line satisfies the following Formula 10:

$$3Lp/(100 \times 10^{1/2}) \geq W \qquad [\text{Formula 10}]$$

in Formula 10,

W is a line width of the electric conducting line, and

Lp is a characteristic length ($\mu m$) of the pixel defined by a 0.5-squared value of an area of each pixel of the display to which the electric conducting substrate is applied.

Further, another exemplary embodiment of the present invention provides an electric conducting substrate, comprising:

a transparent substrate and an electric conducting pattern comprising an electric conducting line provided on the transparent substrate, in which a visible line width ($W_v$) of the electric conducting line satisfies the following Formula 12 and is more than 0 to 3.6 $\mu m$ or less:

$$W_v = W \times R_m \qquad [\text{Formula 12}]$$

in Formula 12,

W is a line width of the electric conducting line, and $R_m$ is reflectivity of an electric conducting line material configuring the electric conducting pattern.

Further, another exemplary embodiment of the present invention provides an electronic device comprising the electric conducting substrate.

Further, another exemplary embodiment of the present invention provides a display device comprising the electric conducting substrate.

Advantageous Effects

According to the present invention, in the case of using a correlation of an average of a characteristic length of a cell closed by an electric conducting line and a line width of an electric conducting line, an electric conducting substrate having excellent electric conductivity and not obstructing a view may be provided. As a result, like a touch panel or an OLED illumination, the electric conducting substrate may be useful in an electronic device in which securing a view is important.

Further, according to the present invention, since a pitch according to a pixel of a display may be derived from a diagonal length (inch) of an effective screen part of the display and as a result, a pitch and a line width according to a pixel of a metal mesh pattern may be derived, a viewing characteristic of the electric conducting pattern may be more effectively improved by controlling a relationship between the line width, the pitch, and the like of the metal mesh pattern and the pixel pitch and the like of the display.

BEST MODE

Figure 1:
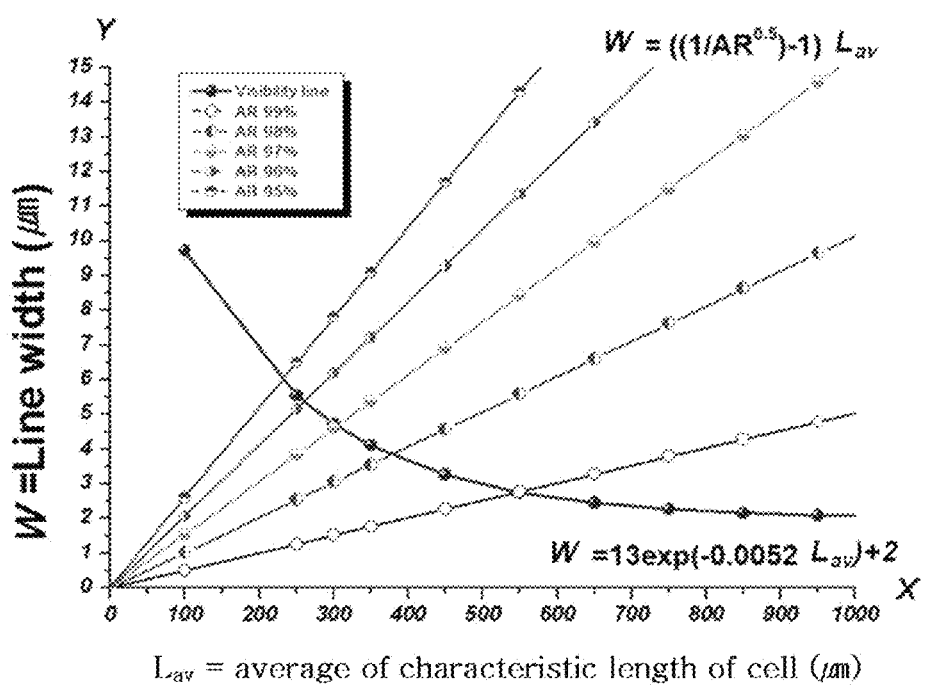
FIG. 1 illustrates allowable regions of a line width (W) of an electric conducting line and an average of characteristic lengths of cells closed by the electric conducting line which are defined by graphs of Formula 1 and Formula 2 defined in the present invention according to an aperture ratio.

Hereinafter, the present invention will be described in more detail.

An electric conducting substrate according to the present invention is an electric conducting substrate comprising a transparent substrate and an electric conducting pattern comprising an electric conducting line provided on the transparent substrate, in which the electric conducting pattern comprises cells closed by the electric conducting line, a 0.5-squared value of an area of the cell is defined as a characteristic lengths (Lc) of the cells, and when a graph 1 representing the following Formula 1 and a graph 2 representing the following Formula 2 are illustrated by setting an average of characteristic lengths ($Lc_{av}$) of the cells as an X axis and setting a line width (W) of the electric conducting line as a Y axis, the line width (W) of the electric conducting line and the average of characteristic lengths ($Lc_{av}$) of the cells are comprised in a crossing region of a lower region of the graph 1 and a lower region of the graph 2.

$$W = [(1/AR^{0.5}) - 1]Lc_{av} \quad \text{[Formula 1]}$$

$$W = 13\exp(-0.0052Lc_{av}) + \alpha \quad \text{[Formula 2]}$$

In Formulas 1 and 2,

W is a line width of the electric conducting line, $Lc_{av}$ is an average of characteristic lengths of cells closed by the electric conducting line, AR is an aperture ratio of the electric conducting pattern, and α is a constant.

In the related art, as an electric conducting pattern used in an electronic device, a pattern having a simple shape such as a stripe shape or a mesh shape is frequently used, but recently, an attempt to use an electric conducting substrate using an electric conducting pattern having various shapes in the electronic device for avoiding moire and the like is being made.

However, as the shape of the electric conducting pattern is various, a reference for decreasing visibility of the electric conducting pattern cannot be found in a use in which securing a view is largely required like a touch panel.

Further, in the case of unlimitedly increasing the aperture ratio of the electric conducting pattern or unlimitedly decreasing the line width of the electric conducting line, there are problems in that it is difficult to reach such a scale due to a manufacturing technique, costs are largely increased, and other physical properties required for the corresponding device such as electric conductivity are not satisfied.

The present invention was derived based on the found fact that visibility of the electric conducting pattern does not simply depend on only one or two conditions such as an aperture ratio or a width of the electric conducting line, but depends on various conditions such as a shape, a size, and an aperture ratio of the electric conducting pattern and a line width of the electric conducting line and a distance between lines. Accordingly, if the electric conducting pattern comprises cells closed by the electric conducting line, the present invention may provide an electric conducting pattern which does not obstruct a view, by controlling an aperture ratio or a line width of the electric conducting line within a predetermined range, regardless of a shape of the electric conducting pattern.

In the present invention, the characteristic length (Lc) of the cell closed by the electric conducting line was defined as the 0.5-squared value of the area of the cell. By defining the characteristic length as described above, as long as the electric conducting pattern comprises the cells closed by the electric conducting line, conditions for configuring the electric conducting pattern not obstructing the view may be derived regardless of a shape of the electric conducting pattern. The characteristic length of the cell may become an index of a shape and a size of the electric conducting pattern and a distance between the lines of the electric conducting line which influence visibility of the electric conducting pattern.

In the present invention, the following Formula 1 is a formula between a characteristic length of the cell and a width of the electric conducting line according to an aperture ratio.

$$W = [(1/AR^{0.5}) - 1]Lc_{av} \quad \text{[Formula 1]}$$

Meanwhile, in the present invention, in addition to the condition of Formula 1, as a formula determining visibility, Formula 2 representing a relationship between a characteristic length of the cell and a width of the electric conducting line was derived.

$$W = 13\exp(-0.0052Lc_{av}) + \alpha \quad \text{[Formula 2]}$$

In the present invention, visibility of the electric conducting pattern may be clearly secured by satisfying both the condition of the lower region of the graph of Formula 1 and the condition of the lower region of the graph of Formula 2.

In Formula 2, α, which is a constant determined according to a process material or condition, may be generally determined as a real number of 0 to 2, and for example, may be 2.

FIG. 1 illustrates the allowable regions of a line width (W) of a electric conducting line and an average value of characteristic lengths ($Lc_{av}$) of cells closed by the electric conducting line which are defined by graphs of Formula 1 and Formula 2 according to an aperture ratio. The electric conducting substrate which does not obstruct the view may be provided by determining the line width (W) of the electric conducting line and the average of characteristic lengths ($Lc_{av}$) of cells closed by the electric conducting line in a lower overlapped region of two graphs illustrated in FIG. 1.

The electric conducting substrate is comprised in the scope of the present invention as long as satisfying the aforementioned conditions of Formula 1 and Formula 2, but hereinafter, more preferable conditions will be described.

In the present invention, a user will define a relationship between a line width and a pitch of the metal mesh line according to a diagonal length (inch) of an effective screen part of the display for shielding a metal line of the touch panel made of metals while maintaining performance of the display in connection with reflectivity of a material configuring the metal, when the touch panel adopted to the display is configured by a minute metal mesh line.

In the case of a touch panel using an existing metal mesh pattern, as the most important factor to configure the touch panel using the metal mesh pattern, a technique of reducing visibility of lines by refining a line width of the metal mesh pattern has been frequently used. However, in the case of the refinement technique of the line width, as the visibility of lines is varied by a distance of a pitch corresponding to the distance between lines configuring the mesh pattern in addition to the reduction of the line width, selection of an appropriate pitch for the varied visibility is required. In addition, finally, as the size of the pitch has a correlation with an optical characteristic such as moire or transmittance, freedom in the degree of a design by a manufacturer deteriorates when manufacturing the touch panel using a mesh pattern.

In order to overcome the above shortcomings, in the present invention, an appropriate pitch according to a diagonal length of the effective screen part of the display was first set. Further, in order to solve the visibility problem of the line which may occur in an existing invention according to the pitch, the visibility of the line is changed by controlling reflectivity of metal, thereby minimizing the correlation between the pitch and the line width. Further, accordingly, when the touch panel is manufactured, a method of maximally shielding the line and freely setting a pitch in the moire or transmittance is suggested to a user.

Figure 2:
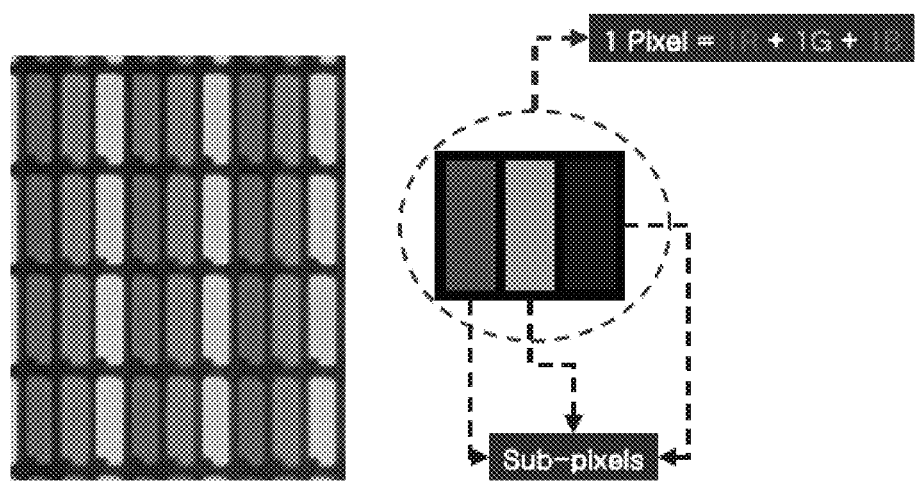
FIG. 2 is a diagram illustrating pixels and subpixels of a display according to an exemplary embodiment of the present invention.

In general, in the display, a size of a pixel is defined according to a distance at which a person views the display. In this case, the pixel means a set of subpixels constituted by R/G/B, and since shapes of most of pixels are close to a square, a pitch of the pixel means a size of the pixel. Currently, the pixel used in the display generally has a pixel size of about 75 μm in the case of a mobile, about 150 μm in the case of a model such as a tablet or laptop computer and a monitor, and about 200 μm in the case of a TV model, according to a use distance. Hereinafter, FIG. 2 illustrates pixels and subpixels of a display according to an exemplary embodiment of the present invention.

As described above, in the display, a pitch of the pixel is generally defined according to an average distance at which people use the display. For example, in an LCD, since it is assumed that a pitch of the pixel of the display has generally a square shape, the pitch of the pixel of the display may be inferred through information on specification of the display.

First, a pitch of the pixel inferred through a pixel per inch (PPI) displayed in the display is as follows.

The PPI generally means the number of pixels comprised within a diagonal length of 1 inch of the effective screen part of the display. Accordingly, assuming that the PPI represented in the display is 200, since the case means that about 200 pixels exist within 1 inch, it may be understood that the pitch of the pixel is $P_{pixel}$=2.54 cm/200=0.0127 cm, that is, a pitch of the pixel of about 127 μm. If there is no information on the PPI, the PPI may be calculated by a number designated in resolution, and in the case where information on the display is represented like WXGA, 1280×800 corresponding the WXGA corresponds to information from which the PPI may be inferred. In addition, the PPI may be inferred through a maximum resolution information value represented by various methods. As one example, in the case where information designated in resolution is A×B, when a diagonal inch represented in the corresponding display is I, $(A^2+B^2)^{1/2}$ corresponds to the number of pixels positioned at the diagonal of the display, and as a result, $(A^2+B^2)^{1/2}/I$ corresponds to the PPI. That is, the pixel pitch of this case may be represented by $P_{pixel}$=2.54 cm×I/$(A^2+B^2)^{1/2}$.

In summary, a pitch $P_{pixel}$ of the pixel may be represented by the following Equation 1.

$$P_{pixel}=2.54 \text{ cm}/PPI=2.54 \text{ cm}(I/(A^2+B^2)^{1/2}) \quad \text{[Equation 1]}$$

In Equation 1,
A represents maximum resolution in a horizontal direction of the display, and B represents maximum resolution in a vertical direction of the display.

Products which are mainly distributed in a current market were examined by a result of converting a pixel size of a product by using the aforementioned PPI or resolution. As a result, it may be verified that displays that have various pixel pitches up to a level range of 77 to 200 μm in the case of a mobile are mainly adopted, and displays having levels of 170 to 240 μm in the case of a laptop computer, 250 to 300 μm in the case of a monitor, and 230 to 635 μm in the case of a TV are mainly adopted.

Figure 3:
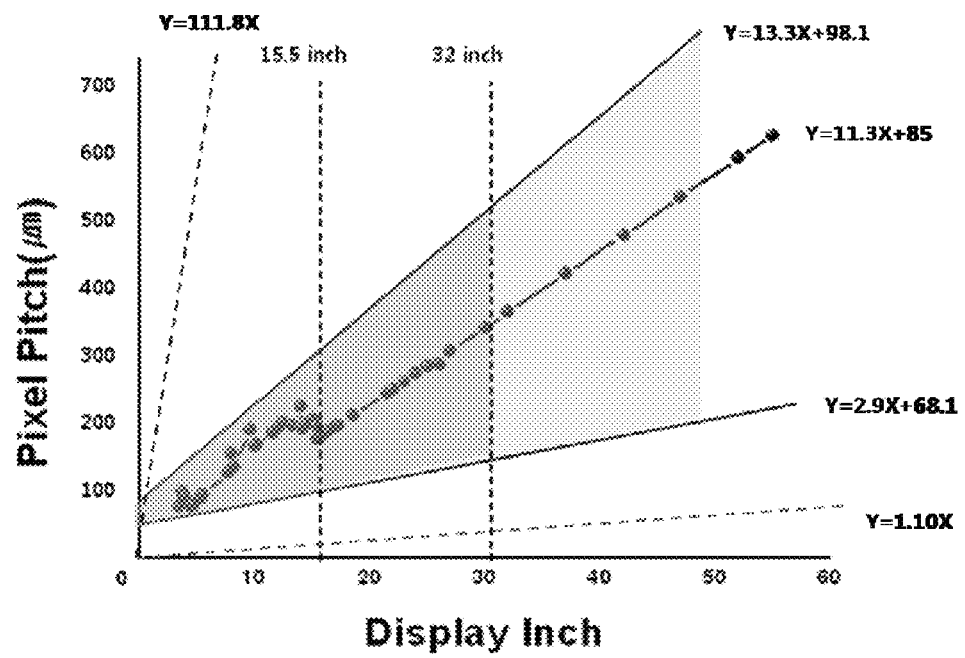
FIG. 3 is a diagram illustrating a correlation of a pixel pitch to a diagonal length (inch) of an effective screen part in the display according to the exemplary embodiment of the present invention.

On the basis of the result, the present inventors derived a correlation of a pixel pitch to a diagonal length (inch) of an effective screen part in the display, and the derived result is illustrated in FIG. 3.

Figure 4:
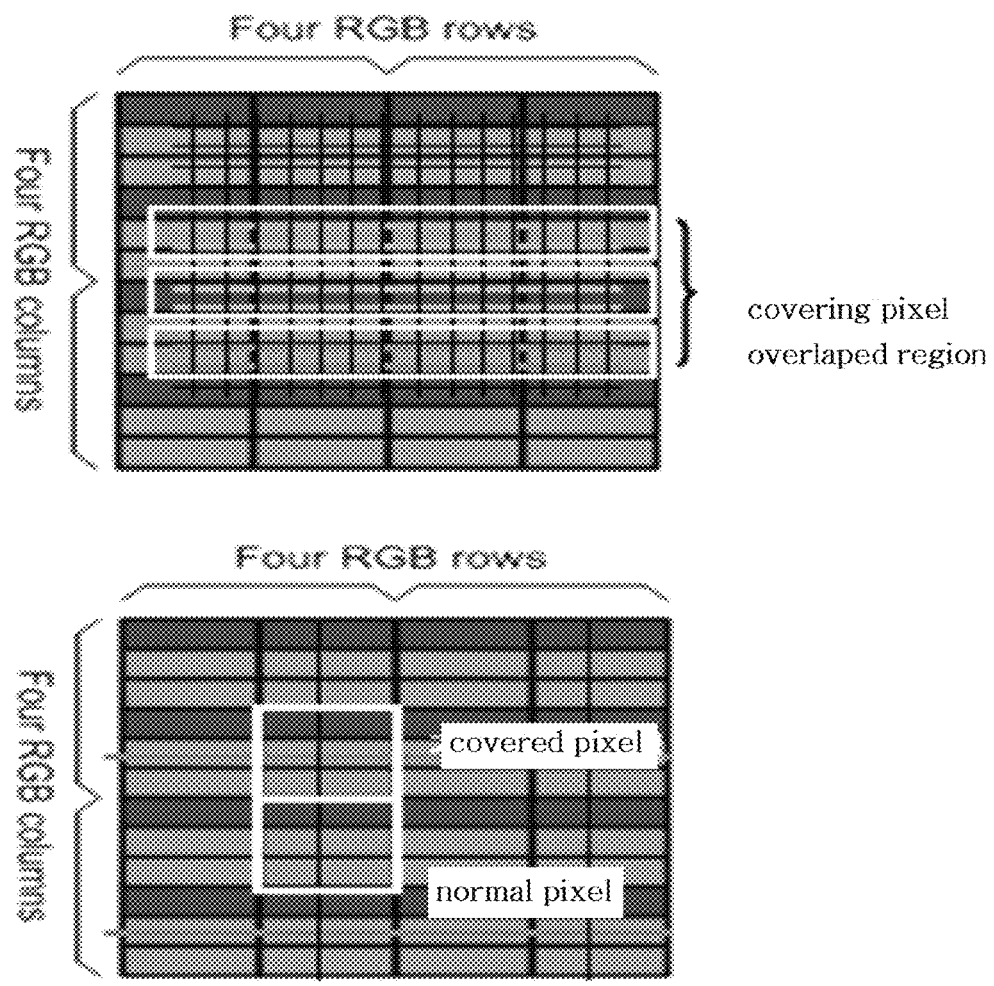
FIG. 4 is a diagram schematically illustrating non-uniformity of mixed colors of pixels in the display according to the exemplary embodiment of the present invention.

Through the range of the pixel pitch according to the diagonal length of the effective screen part in the display presented above, in the present invention, a range of a pitch of the metal mesh pattern may be defined through the following analysis. First, when it is assumed that a state in which the mesh pattern does not rotate is most preferable in the case where the metal mesh pattern is mounted on the display, since only one mesh line or cross point of the mesh per one pixel is positioned, a mixed color of the pixels in the display is uniformly maintained. When broadly interpreting the viewpoint, although it is considered that the pixel of the display is generally constituted by three subpixels having a length ratio of about 3:1, and in the case of an OLED, the pixel is constituted by four subpixels in a pentile mode, basically, in the case of introducing a pitch of the mesh pattern 0.25 times or less of a pitch region of the aforementioned pixel, non-uniformity of local mixed colors of pixels may occur by the line width of the mesh pattern or a cross point of the mesh pattern (because a region where pixel covering frequently occurs exists), and therefore the pitch of the mesh pattern is set to preferably 0.25 times or more of the pitch of the pixel. Furthermore, in the case where the pitch of the metal mesh pattern is set to the pitch of the pixel or more, when the pitch of the metal mesh pattern is set to 2 times or more of the pitch of the pixel, since pixels covered by line components of the metal mesh pattern and pixels not covered by line components are alternately shown as illustrated in FIG. 4, non-uniformity of the entire mixed colors may occur.

Accordingly, the present inventors introduced a pitch that the metal mesh pattern of the touch panel is required to have in the corresponding display.

An electric conducting substrate according to the present invention is an electric conducting substrate comprising a transparent substrate and an electric conducting pattern comprising an electric conducting line provided on the transparent substrate, in which the electric conducting pattern comprises cells closed by the electric conducting line, and a characteristic length (Lc) of the cells defined by a 0.5-squared value of an area of the cell satisfies the following Formula 3.

$$Y_1/n \le Lc \le 2Y_2 \quad \text{[Formula 3]}$$

In Formula 3, n is the number of subpixels arranged in one direction in each pixel of the display to which the electric conducting substrate is applied, $Y_1$ and $Y_2$ are represented by the following formulas, respectively.

$$Y_1 = (2.9Q + 68.1) \times 1 \; \mu m/1 \; inch$$

$$Y_2 = (13.3Q + 98.1) \times 1 \; \mu m/1 \; inch$$

In the formulas, Q is a diagonal length (inch) of an effective screen part of the display to which the electric conducting substrate is applied.

Further, an electric conducting substrate according to the present invention is an electric conducting substrate comprising a transparent substrate and a electric conducting pattern comprising an electric conducting line provided on the transparent substrate, in which the electric conducting pattern comprises cells closed by the electric conducting line, and a characteristic length (Lc) of the cells defined by a 0.5-squared value of an area of the cell satisfies the following Formula 4.

$$Lp/n \leq Lc \leq 2Lp \quad \text{[Formula 4]}$$

In Formula 4, n is the number of subpixels arranged in one direction in each pixel of the display to which the electric conducting substrate is applied, and Lp is a characteristic length of the pixel defined by a 0.5-squared value of an area of each pixel of the display to which the electric conducting substrate is applied.

Further, in the present invention, the characteristic length (Lc) of the cells may satisfy the following Formula 5.

$$P_{pixel\,1}/n \leq Lc \leq 2P_{pixel\,2} \quad \text{[Formula 5]}$$

In Formula 5, n is the number of subpixels arranged in one direction in each pixel of the display to which the electric conducting substrate is applied, and $P_{pixel\,1}$ is a pitch of a short width of each pixel of the display to which the electric conducting substrate is applied, and $P_{pixel\,2}$ is a pitch of a long width of each pixel of the display to which the electric conducting substrate is applied.

Figure 5:
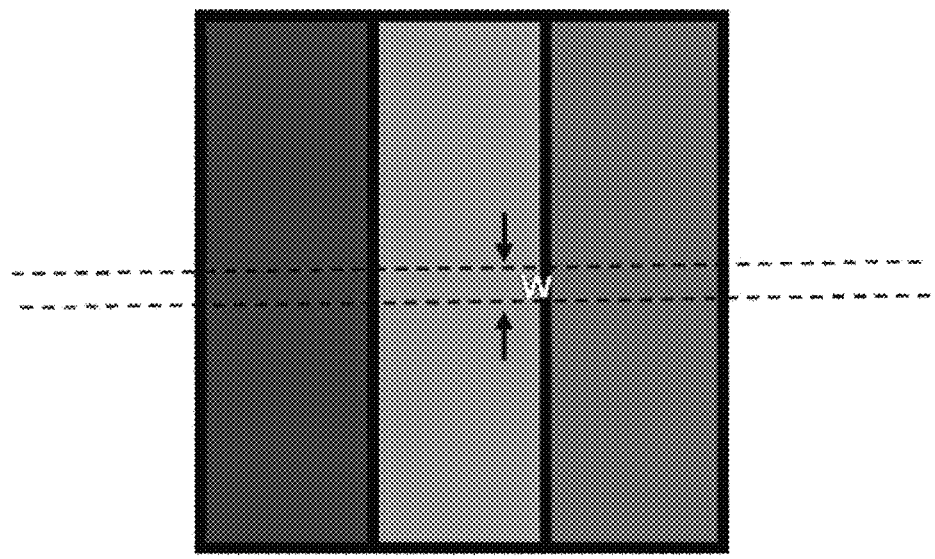
FIG. 5 is a diagram schematically illustrating a region where the display is covered according to a metal mesh pattern according to the exemplary embodiment of the present invention.
Figure 5:
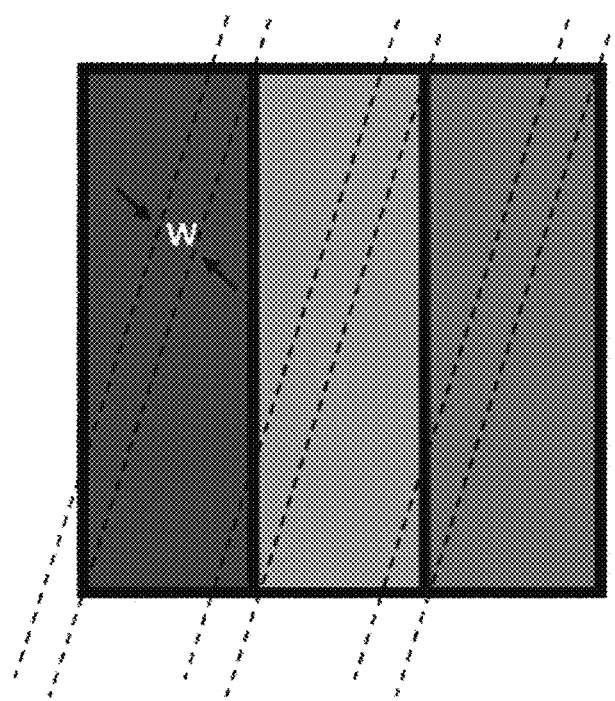

In addition to the introduction of the pitch of the metal mesh pattern defined above, the important part may be a part regarding the line width of the mesh pattern. In general, the pixel of the display is constituted by three subpixels as illustrated in FIG. 5, and in this case, the pixels are covered most when lines of the mesh pattern are disposed in a diagonal line of each subpixel, and inversely, the pixels are covered least when the pixel is covered to be parallel to a short side of each subpixel. Accordingly, from the viewpoint, an opening area may be calculated as follows again according to a line width of the metal mesh pattern when the display is covered.

As described above, since a size of the pixel according to the display is $P_{pixel} = 2.54 \; cm/PPI = 2.54 \; cm \times I/(A^2+B^2)^{1/2}$, opening areas as compared with before covering the pixel in each case may be represented by $(P^2_{pixel} - P \times W)/P^2_{pixel}$ and $(P_{pixel} - 10^{1/2} \times P \times W)^2 * P^2_{pixel}$, respectively. In this case, generally, in order that people do not recognize the mixed color, a difference in an aperture ratio needs to be within about 3%. Therefore, a correlation between the pitch of the pixel of the display and the line width of the metal mesh pattern of the touch panel was derived on the basis thereof.

An electric conducting substrate according to the present invention is an electric conducting substrate comprising a transparent substrate and an electric conducting pattern comprising an electric conducting line provided on the transparent substrate, in which a line width (W) of the electric conducting line satisfies the following Formula 6.

$$0.03 Y_3 \geq W \quad \text{[Formula 6]}$$

In Formula 6,

W is a line width of the electric conducting line, $Y_3$ is a real number within a range of $Y_1 \leq Y_3 \leq Y_2$, and here, $Y_1$ and $Y_2$ are represented by the following formulas, respectively.

$$Y_1 = (2.9Q + 68.1) \times 1 \; \mu m/1 \; inch$$

$$Y_2 = (13.3Q + 98.1) \times 1 \; \mu m/1 \; inch$$

In the formulas, Q is a diagonal length (inch) of an effective screen part of the display to which the electric conducting substrate is applied.

Further, an electric conducting substrate according to the present invention is an electric conducting substrate comprising a transparent substrate and an electric conducting pattern comprising an electric conducting line provided on the transparent substrate, in which a line width (W) of the electric conducting line satisfies the following Formula 7.

$$0.03 Lp \geq W \quad \text{[Formula 7]}$$

In Formula 7,

W is a line width of the electric conducting line, and

Lp is a characteristic length of the pixel defined by a 0.5-squared value of an area of each pixel of the display to which the electric conducting substrate is applied.

Further, a line width (W) of the electric conducting line satisfies the following Formula 8.

$$0.03 P_{pixel} \geq W \quad \text{[Formula 8]}$$

In Formula 8,

W is a line width of the electric conducting line, and $P_{pixel}$ is a pitch of each pixel of the display to which the electric conducting substrate is applied.

Further, an electric conducting substrate according to the present invention is an electric conducting substrate comprising a transparent substrate and an electric conducting pattern comprising an electric conducting line provided on the transparent substrate, in which a line width (W) of the electric conducting line satisfies the following Formula 9.

$$3Y_3/(100 \times 10^{1/2}) \geq W \quad \text{[Formula 9]}$$

In Formula 9,

W is a line width of the electric conducting line, and $Y_3$ is a real number ($\mu m$) within a range of $Y_1 \leq Y_3 \leq Y_2$, and here, $Y_1$ and $Y_2$ are represented by the following formulas, respectively.

$$Y_1 = (2.9Q + 68.1) \times 1 \; \mu m/1 \; inch$$

$$Y_2 = (13.3Q + 98.1) \times 1 \; \mu m/1 \; inch$$

In the formulas, Q is a diagonal length (inch) of an effective screen part of the display to which the electric conducting substrate is applied.

Further, an electric conducting substrate according to the present invention is an electric conducting substrate comprising a transparent substrate and an electric conducting pattern comprising an electric conducting line provided on the transparent substrate, in which a line width (W) of the electric conducting line satisfies the following Formula 10:

$$3Lp/(100 \times 10^{1/2}) \geq W \quad \text{[Formula 10]}$$

In Formula 10,

W is a line width of the electric conducting line, and

Lp is a characteristic length (μm) of the pixel defined by a 0.5-squared value of an area of each pixel of the display to which the electric conducting substrate is applied.

Further, a line width (W) of the electric conducting line may satisfy the following Formula 11.

$$3P_{pixel}/(100\times10^{1/2})\geq W \quad [\text{Formula 11}]$$

In Formula 11,

W is a line width of the electric conducting line, and $P_{pixel}$ is a pitch of each pixel of the display to which the electric conducting substrate is applied.

Generally, the display makes white and black by mixing three colors of R, G, and B to display images. From the viewpoint, the most important part may be a part regarding visibility of the metal mesh pattern in a black state. The reason that the visibility of the metal mesh pattern in the black state is important may be because the black state is defined as the most basic state in the case of an LCD, and even in a screen, expression of a black color has the very important effect on a contrast ratio which is the most important factor of image quality of the display. From the viewpoint, the visibility in the black state of the metal line configuring the metal mesh pattern may be the most important factor, and a factor influencing the visibility of the metal line has very large correlation with not only a physical line width of the metal but also reflectivity of a material constituting the metal. In the present invention, from the viewpoint, a concept of a new visible line width comprising not only a physical line width in the related art but also reflectivity of a material constituting the metal line is defined as follows.

In the present invention, a visible line width ($W_v$) of the electric conducting line satisfies the following Formula 12.

$$W_v = W \times R_m \quad [\text{Formula 12}]$$

In Formula 12,

W is a line width of the electric conducting line, and $R_m$ is reflectivity of an electric conducting line material configuring the electric conducting pattern.

From the viewpoint of reflectivity, when a pitch of a pixel of the display is $P_{pixel}$, a line width of the mesh pattern is W, reflectivity of the mesh pattern material is $R_m$, and bright room reflectivity of the display panel in a display off mode to which the mesh pattern is applied is a, total reflectivity of the display comprising the metal mesh pattern may be represented by the following formula.

$$P_{pixel} \times W \times R_m (P^2_{pixel} - P \times W) \times a$$

In the case of being indistinguishable by the naked eye, when an absolute value of $[b_1/b_0-1]$ is b, bright room reflectivity of a display panel with the electric conducting pattern in the display off mode is $b_1$, and bright room reflectivity of only a display panel where the electric conducting pattern is not provided in the display off mode is $b_0$, the formula may be summarized by the following formula.

$$(1-b)\times a \times P^2_{pixel} \leq P_{pixel} \times W \times R_m(P^2_{pixel}-P\times W)\times a \leq (1+b)\times a \times P^2_{pixel}$$

The formula is summarized as follows.

$$a\times(W-b\times P_{pixel}) \leq W\times R_m \leq a\times(W+b\times P_{pixel})$$

In this case, since $W \times R_m$, may be substituted with the visible line width ($W_v$) summarized in Formula 12 and a value of the visible line width is 0 or more, finally, the following Formula 13 may be derived.

$$0 \leq a\times(W-b\times P_{pixel}) \leq W_v \leq a\times(W+b\times P_{pixel}) \quad [\text{Formula 13}]$$

Further, from Formula 13, since $0 \leq (W-b\times P_{pixel})$, Formula 13 has a relationship of $b \leq W/P_{pixel}$.

In Formula 13, a may be 0.11 or less, but is not limited thereto. Further, b may be 0.03 or less and 0.115 or less, but is not limited thereto.

In the present invention, the visible line width ($W_v$) according to Formula 13 may be more than 0 to 3.6 μm or less and more than 0 to 2.4 μm or less, but is not limited thereto.

Figure 10:
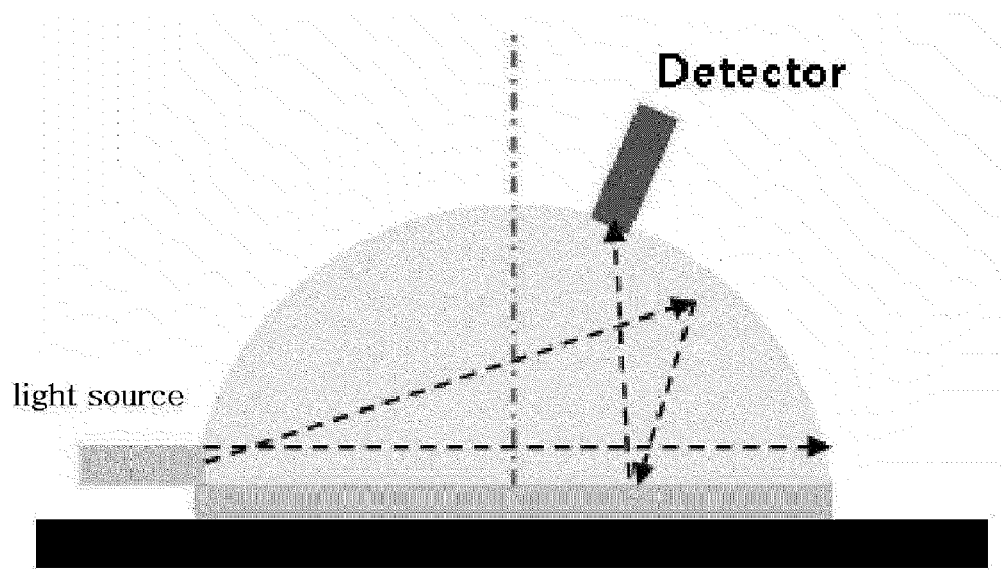
FIG. 10 is a diagram illustrating a configuration for measuring reflectivity in a bright room according to an exemplary embodiment of the present invention.

In the present invention, the bright room reflectivity is a value observed by measuring only reflectivity of a surface to be measured after reflectance of an opposite surface of a surface to measure reflectance is set to 0 by using a black paste, a tape, or the like, and in this case, as an inputted light source, a diffuse light source the most similar to an ambient light condition was selected. Further, in this case, a measurement position where the reflectance was measured was based on a position inclined at about 7 degrees from a vertical line of a semicircle of an integrating sphere. The following FIG. 10 illustrates a configuration for measuring the reflectance as describe above.

Figure 11:
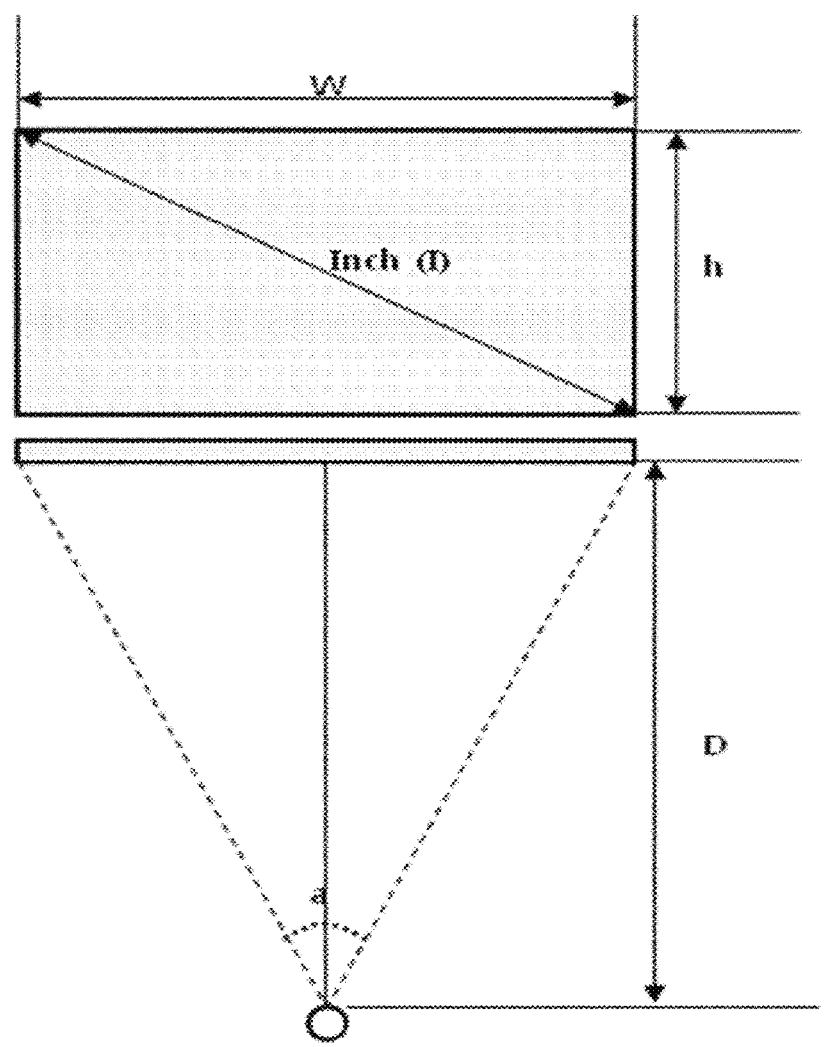
FIG. 11 is a diagram schematically illustrating a correlation of a visible line width according to an exemplary embodiment of the present invention.

As illustrated in the following FIG. 11, when a ratio of a width and a length of a screen is 16:9, a height of the screen is h, a diagonal length is d, a viewing angle at which a user views the display is a, a horizontal length of the screen is w, and a viewing distance between eyes and the screen is D, $$w = D\times\tan(a/2)\times 2, \text{ and}$$

an inch corresponding to the diagonal length is $$h = w\times 9/16$$

$$I(w^2+h^2)^{1/2} = [(D\times\tan(a/2)\times 2)^2 + (D\times\tan(a/2)\times 2\times 9/16)^2]^{1/2}$$

It was known that a human vision has a view of horizontal 160 degrees and vertical 175 degrees when only one eye is opened and a view of horizontal 200 degrees and vertical 135 degrees when both eyes are opened, and a viewing angle overlapped when both eyes are opened is horizontal 120 degrees and vertical 135 degrees. That is, viewing when the both eyes are opened means that only an object within horizontal 120 degrees may be distinguished, and since a viewing angle which may be focused within the 120 degrees is about 30 degrees, generally, assuming that a viewing angle when the user views the display is 30 degrees, an equation is summarized as follows.

$$D = 1.6264I(\text{inch is converted to cm to be substituted;}$$
Unit: cm)

Figure 12:
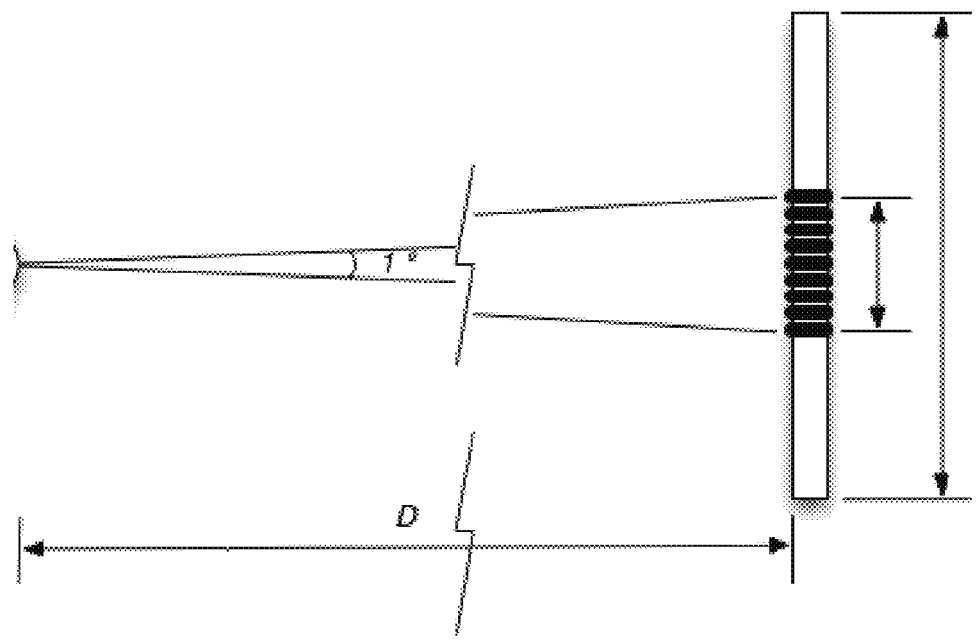
FIG. 12 is a diagram illustrating definition of a cycle per degree (CPD) according to an exemplary embodiment of the present invention.
Figure 13:
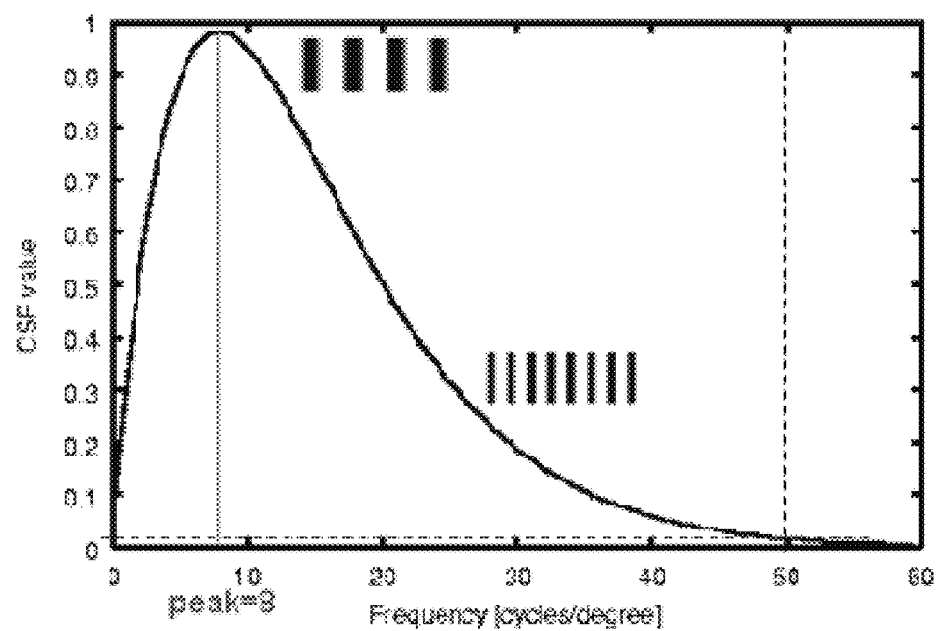
FIG. 13 is a diagram illustrating a visual function depending on a CPD according to an exemplary embodiment of the present invention.

An ability of the human to discern objects is expressed by angle resolution. The angle resolution indicates the number of pairs of black lines and white lines which may be distinguished within a range of 1 degree, and a pair of black and white lines is called one cycle and expressed as cycle per degree (CPD) (FIG. 12). The CPD represents the number of cycles which exist in a width w corresponding to a viewing angle range of 1 degree at a distance far away by D as described below, and it is known that 50 CPD, that is, 50 cycles are the limit of the human retina (FIG. 13).

A function according to a distance of the CPD is defined as $D = w/\tan(1 \text{ degree}/2) \times 2$ according to a distance D as illustrated in FIG. 12, and in this case, when the function is converted to an equation for w, $w = 2D \tan(0.5 \text{ degree}) = 0.01745D$.

In this case, (the number of pixels comprised within a distance w×2) is just a CPD value, and the upper limit and the lower limit which may be discerned by the retina are 0.5 and 50, respectively.

Since this may be analyzed by a pair of pixels, finally, the corresponding pixels correspond to 1 to 100, and when the inch equation according to the distance D is substituted to w=2D tan(0.5 degree)=0.017456D, since D is 1.6264I, the equation may be converted to w=0.0284I (cm).

Since values corresponding to the limit of the retina are P=w and P=w/100, when the values are converted to an inch and a pitch of the pixel, respectively, the following values are obtained.

$$1P=0.0284I \rightarrow P=0.0142I(cm)$$

$$100P=0.0284I \rightarrow P=0.00028I(cm).$$

Since a unit is cm, when the unit is converted to micrometer,

P=284I

P=2.81I (μm)

When I is substituted in the unit of an inch, if the equation is changed so that the pixel pitch is directly calculated,

P=111.8I

P=1.10I

The equation corresponds to a dotted region of FIG. 3 when represented in a graph.

However, all the regions may not be regions where the display is manufactured, and the upper limit and the lower limit of the pixel pitch for an inch of a display which is generally manufactured in current, and a pixel according to an inch of a display which is mainly manufactured are represented by a red solid line and a blue solid line, and a black solid line of FIG. 3, respectively. In this case, when the pitch of the pixel according to an inch of a display which is mainly manufactured which is represented by the black solid line is converted to the CPD, the pitch is converted to a CPD value of about 9.8, which may be understood as the meaning that a rule that about 20 pixels are arranged within about 1 degree from a distance viewed by the viewer is followed and may correspond to a region near 8 which is a region where a visual function according to a CPD becomes maximum in FIG. 13.

In the present invention, the electric conducting line may be constituted by straight lines, but may be variously modified by curved lines, wave lines, zigzag lines, and the like. Further, the electric conducting line may have a mixed shape of at least two kinds of lines having the shapes.

In the present invention, the electric conducting pattern may comprise polygonal patterns of three angles or more, for example, a triangle, a quadrangle, a pentagon, a hexagon, a heptagon or more, as cells closed by the electric conducting line.

In the present invention, the electric conducting pattern may comprise a regular pattern. Here, the regular pattern means that the shape of the pattern has regularity. For example, the electric conducting pattern may comprise a pattern having a mesh shape such as a rectangle or a square or a hexagon shape.

In order to prepare the aforementioned electric conducting pattern, first, after determining a desired pattern shape, the electric conducting pattern having a thin line width and precision may be formed on the transparent substrate by using a printing method, a photolithography method, a photography method, a method using a mask, a sputtering method, an inkjet method, or the like.

The printing method may be performed by transferring and firing a paste comprising an electric conducting pattern material on the transparent substrate in a desired pattern shape. The transfer method is not particularly limited, but the desired pattern may be transferred on the transparent substrate by forming the pattern shape on a pattern transfer medium such as an intaglio or a screen and using the formed pattern shape. A method of forming the pattern shape on the pattern transfer medium may use a known method in the art.

The printing method is not particularly limited and may use a printing method such as offset printing, screen printing, gravure printing, flexo printing, and inkjet printing, and may use a complex method of one kind or more thereof. The printing method may use a roll to roll method, a roll to plate method, a plate to roll method, or a plate to plate method.

Figure 6:
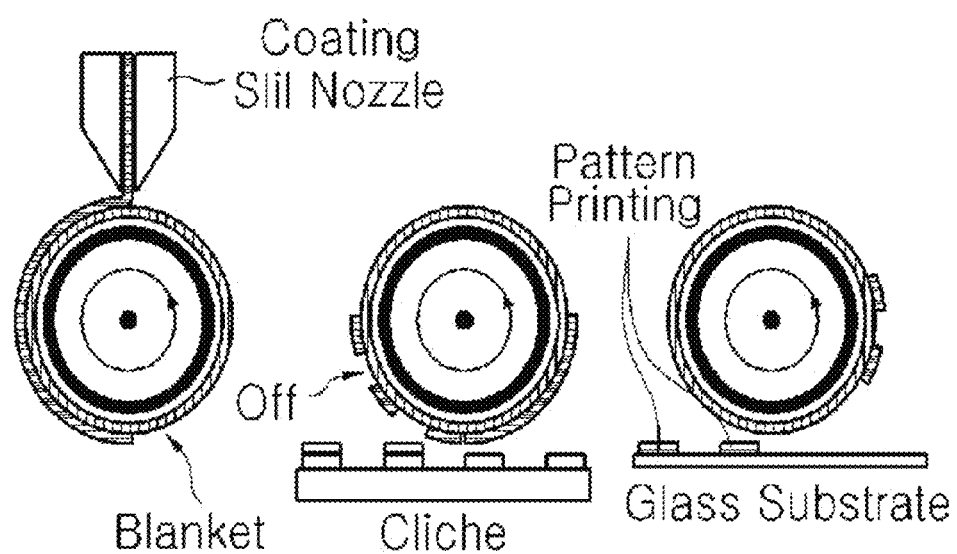
FIGS. 6 and 7 illustrate a process of forming an electric conducting pattern of a touch panel according to the present invention.

In the present invention, in order to implement a precise electric conducting pattern, it is preferable to apply the reverse offset printing method. FIG. 6 illustrates a direct and indirect process using a reverse offset printing method. Referring to FIG. 6, when etching is performed on a silicon-based rubber called a blanket, a method of forming a desired pattern may be performed by coating ink capable of serving as a resist throughout an area, primarily removing an unnecessary portion through an intaglio having a pattern which is called a cliche, and secondarily transferring a print pattern remaining on the blanket to a film where metal and the like are deposited or a base such as glass, and then firing and etching the transferred print pattern. In the case of using the method, as uniformity of a line height in the entire area is secured by using the base deposited with the metal, it is advantageous that resistance in a thickness direction may be uniformly maintained.

Figure 7:
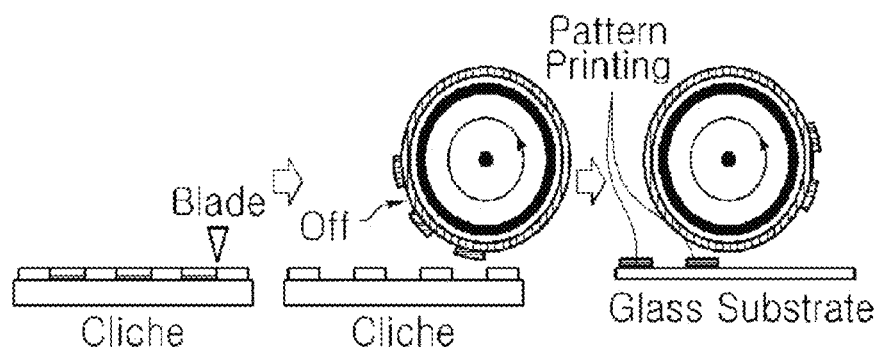

Another example to which the present invention may be applied uses a gravure offset method as illustrated in FIG. 7. The gravure offset printing may be performed by filling a paste in the intaglio having the pattern, primarily transferring the paste to the blanket and then secondarily transferring the paste by contacting the blanket and the transparent substrate. In addition, the gravure printing may be performed by a modified method of winding a blanket having the pattern on a roll, filling a paste in the pattern, and then transferring the pattern to the transparent substrate. In the present invention, the methods may be used in combination, in addition to the methods. Further, other printing methods known to those skilled in the art, for example, a screen printing method may also be used.

The present invention is not limited to the above printing methods and may also use a photolithography process. For example, the photolithography process may be performed by a method of forming an electric conducting pattern material layer on the entire surface of the transparent substrate, forming a photoresist layer thereon, patterning the photoresist layer by a selective exposing and developing process, patterning an electric conducting pattern by using the patterned photoresist layer as an etching resist and then, removing the photoresist layer.

Further, the present invention may also use the photography method. For example, after a photosensitive material comprising silver halide is coated on the transparent substrate, the pattern may also be formed by selectively exposing and developing the photosensitive material. A more detailed example is as follows. First, a negative photosensitive material is coated on a base to form a pattern. In this case, as the base, a polymer film such as PET and acetyl celluloid may be used. Here, a polymer film material member coated with the photosensitive material is called a film. The negative photosensitive material may be generally constituted by silver halide obtained by mixing a little AgI with AgBr reacting to light very sensitively and regularly. Since an image obtained by photographing and developing a general negative photosensitive material is a negative image having an opposite contrast to that of a subject, the photographing may be performed by using a mask having a pattern shape to be formed, preferably, an irregular pattern shape.

In order to increase electric conductivity of the electric conducting pattern formed by using the photolithography and photography processes, a plating process may further be performed. The plating may be performed by using an electroless plating method, a plating material may use copper or nickel, and after copper plating is performed, nickel plating may be performed thereon, but the scope of the present invention is not limited thereto.

Further, the present invention may also use a method using a hard mask. For example, after a mask having a desired electric conducting pattern shape is positioned close to a base, the electric conducting pattern material may be deposited on the base to be patterned. In this case, the deposition method may use a heat deposition method by heat or electron beam, a physical vapor deposition (PVD) method such as sputtering, and a chemical vapor deposition (CVD) method using an organometal material.

Further, the present invention may be manufactured by an imprinting process. The imprinting process may use a method of coating an imprintable resin on a base deposited with electric conducting metal and the like, printing the coated resin by using a prepared mold pattern, patterning a metal line through dry etching and etching processes, removing the resin or patterning the resin for imprinting through a mold, partially filling an electric conducting material between the patterns, and then using the filled electric conducting material or transferring the filled electric conducting material to another base.

In the present invention, the electric conducting pattern may comprise an electric conducting line having a line width of 20 micrometers or less, and may comprise an electric conducting line having a line width of 15 micrometers or less, 10 micrometers or less, 7 micrometers or less, 4 micrometers or less, or 3 micrometers or less. In the present invention, the line width of the electric conducting line may be controlled within the range of 0.5 to 10 micrometers.

In the present invention, an aperture ratio of a third electric conducting pattern, that is, an area ratio of the transparent substrate which is not covered by the pattern is preferably 70% or more, and may be 90% or more, 93% or more, 95% or more, 96% or more, 97% or more, 98% or more, or 99% or more.

According to an exemplary embodiment of the present invention, the conductor may comprise a region where the electric conducting pattern is not formed.

According to an exemplary embodiment of the present invention, the electric conducting pattern may be blackened. As a result, even in the case where the electric conducting pattern is made of a metallic material, visibility may be further reduced. In the case of forming a pattern by directly printing an electric conducting pattern, in order to blacken the electric conducting pattern, a blackening process is performed after adding a blackening material to a paste or ink for forming the electric conducting pattern, or printing and firing the paste or ink to blacken the electric conducting pattern.

The blackening material which may be added to the ink or the paste comprises metal oxide, carbon black, carbon nanotube, black pigment, colored glass flit, and the like. The blackening after firing may be performed by immersing in an oxidation solution, for example, a solution containing a Fe or Cu ion, immersing in a solution containing a halogen ion such as a chlorine ion, immersing in peroxide, nitrate, and the like, and a treatment with halogen gas, or the like, in the case where the ink or the paste is an Ag based material.

In the case of a method of forming the pattern through etching, not a method of directly printing a metallic material, another example of the blackening may use a method of depositing a blackening layer on a surface viewed by a person, depositing a layer for providing electric conductivity thereon, and patterning the layers at once during a subsequent etching process. As an example, in the case of depositing the blackening layer through MoOxNy, depositing an Al layer thereon, and printing and etching resist ink on the base, MoOxNy and Al are simultaneously patterned in an etchant such as a mixed solution of phosphoric acid, nitric acid, acetic acid, and water and thus a desired surface is blackened.

In the present invention, the transparent substrate is not particularly limited, but light transmittance thereof is 50% or more, preferably 75% or more, and more preferably 88% or more. In detail, the transparent substrate may use glass, a plastic substrate, or a plastic film. The plastic substrate or film may use a material which is known in the art, for example, a material made of one or more kinds of resins selected from polyacryls, polyurethanes, polyesters, polyepoxies, polyolefins, polycarbonates, and celluloses. In more detail, the plastic substrate or film is preferably a film having visible-light transmittance of 80% or more, such as polyethylene terephthalate (PET), polyvinylbutyral (PVB), polyethylene naphthalate (PEN), polyethersulfon (PES), polycarbonate (PC), and acetyl celluloid. A thickness of the plastic film is preferably 12.5 to 500 micrometers, more preferably 50 to 450 micrometers, and much more preferably 50 to 250 micrometers. The plastic substrate may be a substrate having a structure in which various functional layers, such as a gas barrier layer for blocking moisture and gas and a hard coat layer for reinforcing strength, improving transmittance, and decreasing a haze value, are laminated on one side or both sides of the plastic film. The functional layers which may be comprised in the plastic substrate are not limited to the aforementioned layers, and various functional layers may be provided.

The electric conducting pattern may be directly formed on a component, for example, a substrate comprised in an element or a device to which the electric conducting substrate of the present invention may be applied, such as a display, a touch panel, and an OLED illumination.

In the present invention, as the electric conducting pattern material, a metal having excellent electric conductivity may be used. Further, a specific resistance value of the electric conducting pattern material is preferably 1 microOhm cm or more and 100 microOhm or less, and more preferably 1 microOhm cm or more and 5 microOhm or less. As a detailed example of the electric conducting pattern material, aluminum, copper, silver, gold, iron, molybdenum, nickel, carbon nanotube (CNT), titanium, and an alloy thereof or oxide, nitride or oxynitride thereof, or the like may be used. However, aluminum is most preferable from the viewpoint of costs and electric conductivity. The electric conducting pattern material may be converted and used into a particle form in the case of directly printing, and in this case, the particle form may be particles having a single composition or a mixed composition of the metals enumerated above.

In the present invention, in the case of using ink or a paste comprising the electric conducting pattern material, the ink or the paste may further comprise an organic binder in addition to the aforementioned electric conducting pattern material in order to facilitate the printing process. The organic binder may have volatility during a firing process. The organic binder may comprise a polyacrylic resin, a polyurethane resin, a polyester resin, a polyolefin resin, a polycarbonate resin, a cellulose resin, a polyimide resin, a polyethylene naphthalate resin, a modified epoxy, and the like, but is not just limited thereto.

The electric conducting substrate according to the present invention may be connected to a power source, and in this case, a resistance value per unit area considering an aperture ratio is 0.01 ohm/square to 1,000 ohm/square and preferably 5 ohm/square to 150 ohm/square at room temperature.

The electric conducting substrate according to the present invention may be used to conduct current or apply voltage by external factors in addition to a configuration of the electric conducting substrate itself. The electric conducting substrate according to the present invention may be variously used for a use of requiring electric conductivity. For example, the electric conducting substrate according to the present invention may be used for an electromagnetic shielding film, a touch panel, an auxiliary electrode for a light emitting element, an auxiliary electrode for a solar cell, and the like. In detail, the auxiliary electrode for a light emitting element may be an auxiliary electrode for an organic light emitting diode (OLED) illumination.

According to an exemplary embodiment of the present invention, an electronic device comprising the aforementioned electric conducting substrate of the present invention is provided. The electronic device may further comprise a display pixel substrate provided on at least one side of the electric conducting substrate, and each pixel of the display pixel substrate may comprise two or more subpixels. In this case, each pixel of the display pixel substrate may comprise three or four subpixels.

The electronic device may be a touch panel, an OLED illumination, an organic solar cell.

Further, according to an exemplary embodiment of the present invention, a display device comprising the aforementioned electric conducting substrate of the present invention is provided. The touch panel according to the present invention may comprise a lower base; an upper base; and an electrode layer provided on any one surface or both surfaces of a surface of the lower base contacting the upper base and a surface of the upper base contacting the lower base. The electrode layer may perform a function for detecting an X-axial position and a Y-axial position, respectively.

In this case, one or both of an electrode layer provided on the lower base and the surface of the lower base contacting the upper base; and an electrode layer provided on the upper base and the surface of the upper base contacting the lower base may be the aforementioned electric conducting substrate according to the present invention. In the case where only any one of the electrode layers is the electric conducting substrate according to the present invention, the other electrode layer may have a pattern known in the art.

In the case where the electrode layers are provided on sides of both the upper base and the lower base to form a two-layered electrode layer, an insulating layer or a spacer may be provided between the lower base and the upper base so that a distance between the electrode layers is uniformly maintained and the electrode layers are not connected to each other. The insulating layer may comprise an adhesive or a UV or thermosetting resin. The touch panel may further comprise a ground part connected with the aforementioned electric conducting pattern. For example, the ground part may be formed at an edge of the surface with the electric conducting pattern of the transparent substrate.

Further, at least one of an anti-reflective film, a polarization film, and an anti-fingerprinting film may be provided on at least one side of the electric conducting substrate. According to a design specification, different kinds of functional films may be further comprised in addition to the aforementioned functional films. The touch panel may be applied to display apparatuses such as an OLED display panel (PDP), a liquid crystal display (LCD), a cathode-ray tube (CRT), and a PDP.

The touch panel according to the present invention is not limited to the above structure, and comprises a structure in which both a first electrode and a second electrode are formed on one base, or a structure in which an electrode layer of the lower base is laminated on a surface where the electrode layer of the upper base is not provided.

According to an exemplary embodiment of the present invention, an auxiliary electrode for an OLED illumination comprising the aforementioned electric conducting substrate of the present invention and an OLED illumination comprising the same are provided. As one example, the OLED illumination according to the present invention comprises a first electrode, an auxiliary electrode disposed on the first electrode, an insulating layer disposed on the auxiliary electrode, at least one organic material layer, and a second electrode, and the auxiliary electrode may be the electric conducting pattern according to the present invention. The auxiliary electrode may be directly formed on the first electrode, and the electric conducting substrate comprising the transparent substrate and the electric conducting pattern may be positioned on the first electrode.

Further, another exemplary embodiment of the present invention provides an auxiliary electrode of an organic solar cell adopting a structure which is the same as or similar to the auxiliary electrode for the OLED illumination and an organic solar cell comprising the same.

Hereinafter, preferable Examples for understanding the present invention will be described. However, the following Examples just exemplify the present invention, and the scope of the present invention is not limited to the following Examples.

EXAMPLE 1

After depositing Al metal on a polyethylene terephthalate (PET) base, a stripe pattern having a line width of 2.7 μm was formed through a printing process, and the electric conducting pattern was formed through etching and releasing processes.

COMPARATIVE EXAMPLE 1

After depositing Al metal on a PET base, a stripe pattern having a line width of 10 μm was formed through a printing process and then a sample was formed through etching and releasing processes.

Figure 8:
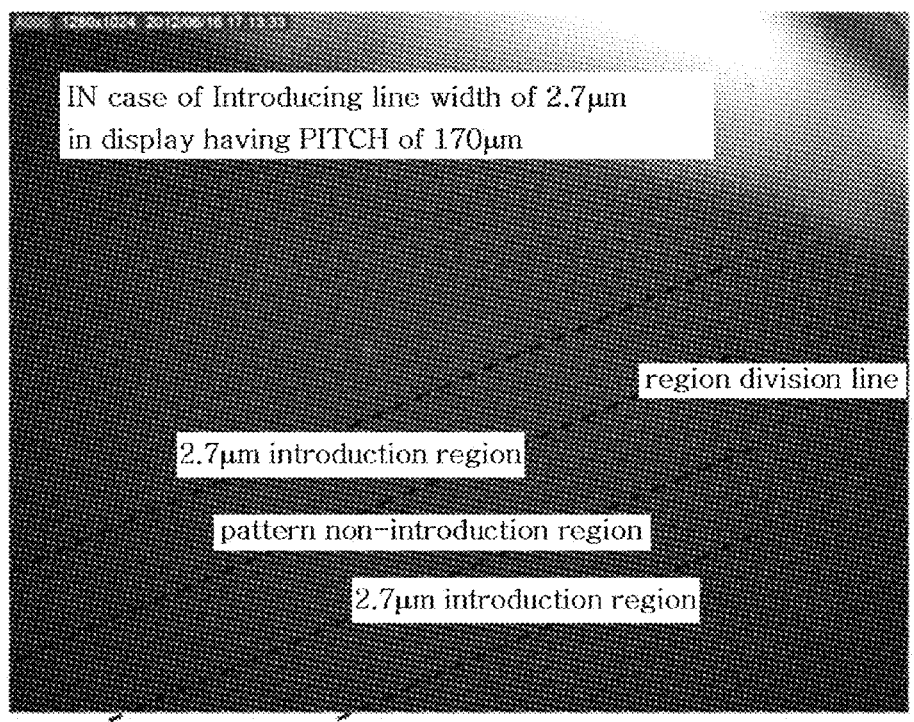
FIGS. 8 and 9 are diagrams illustrating electric conducting patterns according to Example of the present invention and Comparative Example.
Figure 9:
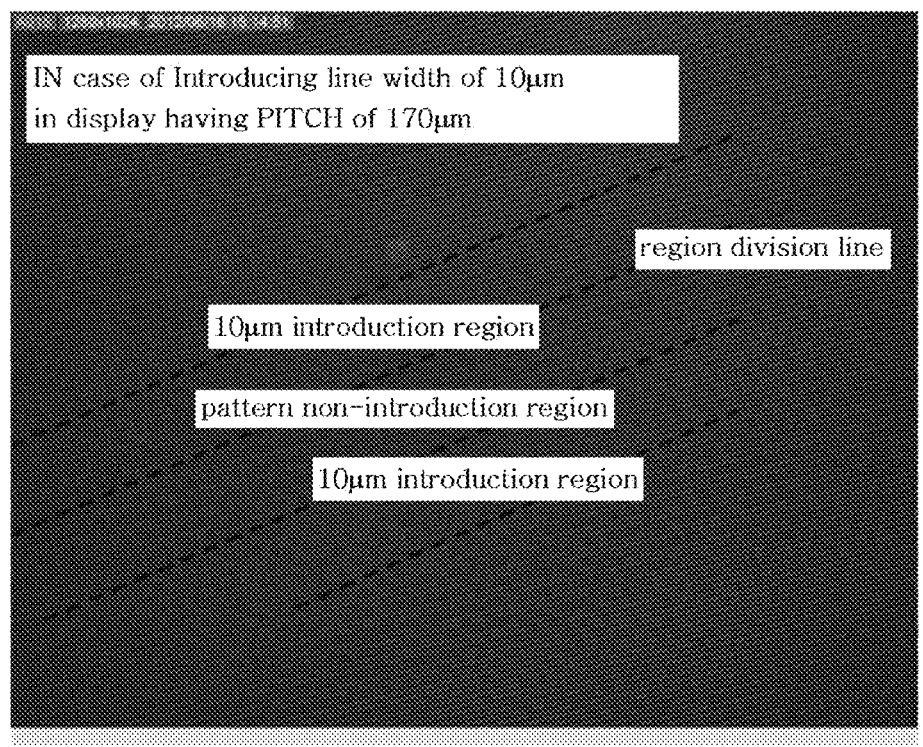

The electric conducting pattern according to Example 1 was illustrated in the following FIG. 8, and the electric conducting pattern according to Comparative Example 1 was illustrated in the following FIG. 9. From the results of FIGS. 8 and 9, it can be seen that the electric conducting pattern having a line width which is 3% more than a pixel pitch of the display had a bad visibility characteristic.

EXAMPLES 2 to 10 and COMPARATIVE EXAMPLES 2 to 10

As illustrated in the following Table 1, after evaluating a length (inch) of a diagonal of an effective screen part of the display, a pixel pitch of the display, a pitch and a line width of a metal mesh pattern, application conformance or not according to the evaluated result was evaluated.

TABLE 1

| | 1 Display (inch) | 2 Display Pixel Pitch | 3 Mesh Pitch | 4 Mesh Physical line width | 6 Visible line width | 7 Application conformance | 8 Note |
|---|---|---|---|---|---|---|---|
| Example 2 | 3.5 | 77 | 120 | 2.3 | 867 nm | OK | |
| Comparative Example 2 | 3.5 | 77 | 300 | 5 | 4.5 μm | NG | 3,4,6 Nonconformance |
| Example 3 | 4 | 100 | 120 | 2.8 | 900 nm | OK | |
| Comparative Example 3 | 4 | 100 | 310 | 8 | 2.4 μm | NG | 3,4 Nonconformance |
| Example 4 | 7.9 | 156 | 200 | 3 | 1.2 μm | OK | |
| Comparative Example 4 | 7.9 | 156 | 200 | 7 | 6.3 μm | NG | 4,6 Nonconformance |
| Example 5 | 10.1 | 170 | 250 | 3.3 | 990 nm | OK | |
| Comparative Example 5 | 10.1 | 170 | 250 | 5.4 | 1.62 μm | NG | 4 nonconformance |
| Example 6 | 13.3 | 224 | 250 | 2.3 | 460 nm | OK | |
| Comparative Example 6 | 13.3 | 224 | 500 | 2.3 | 460 nm | NG | 3 nonconformance |
| Example 7 | 21.5 | 248 | 250 | 5.4 | 1.62 μm | OK | |
| Comparative Example 7 | 21.5 | 248 | 250 | 5.4 | 4.86 μm | NG | 6 nonconformance |
| Example 8 | 23 | 265 | 500 | 7 | 2.1 μm | OK | |
| Comparative Example 8 | 23 | 265 | 810 | 8 | 2.4 μm | NG | 3,4 nonconformance |
| Example 9 | 27 | 311 | 300 | 3.3 | 990 nm | OK | |
| Comparative Example 9 | 27 | 311 | 300 | 10 | 3 μm | NG | 4 nonconformance |
| Example 10 | 42 | 484 | 400 | 3 | 900 nm | OK | |
| Comparative Example 10 | 42 | 484 | 400 | 7 | 6.3 μm | NG | 6 nonconformance |

EXAMPLES 11 and 12 and COMPARATIVE EXAMPLES 11 and 12

As illustrated in the following Table 2, bright room reflectivity and a visible line width of the electric conducting pattern were evaluated.

TABLE 2

| Classification | Bare (LCM Off state) | Example 11 | Comparative Example 11 | Example 12 | Comparative Example 12 |
|---|---|---|---|---|---|
| Mesh constituent material and mesh pitch | | Al 250 μm | Cr/CrOX 250 μm | Al 300 μm | Cr/CrOX 300 μm |
| Display inch/pixel pitch | 10.1/ 170 μm | 10.1/ 170 μm | 10.1/ 170 μm | 10.1/ 170 μm | 10.1/ 170 μm |
| Reflectivity of material | — | 0.92 | 0.2 | 0.92 | 0.2 |
| Physical line width | — | 5 μm | 5 μm | 5 μm | 5 μm |
| Visible line width | — | 4.6 μm | 660 nm | 4.6 μm | 1.65 μm |
| Bright room reflectivity in LCM Off state | 0.11 | 0.14137 | 0.112 | 0.13535 | 0.1083 |
| \|Bright room reflectivity in LCM Off state/Bare) − 1\| = b | 0 | 0.28 | 0.018 | 0.23 | 0.015 |

The invention claimed is:

1. An electric conducting substrate, comprising:
a transparent substrate; and
an electric conducting pattern comprising an electric conducting line provided on the transparent substrate, wherein the electric conducting pattern comprises cells closed by the electric conducting line,
a 0.5-squared value of an area of the cell is defined as a characteristic length (Lc) of the cells, and
when a graph 1 representing the following Formula 1 and a graph 2 representing the following Formula 2 are illustrated by setting an average of characteristic lengths ($Lc_{av}$) of the cells as an X axis and setting a line width (W) of the electric conducting line as a Y axis, the line width (W) of the electric conducting line and the average of characteristic lengths ($Lc_{av}$) of the cells are comprised in a crossing region of a lower region of the graph 1 and a lower region of the graph 2:

$$W=[(1/AR^{0.5})-1]Lc_{av} \quad \text{[Formula 1]}$$

$$W=13\exp(-0.0052Lc_{av})+\alpha \quad \text{[Formula 2]}$$

in Formulas 1 and 2,
W is a line width of the electric conducting line,
$Lc_{av}$ is an average of characteristic lengths of cells closed by the electric conducting line,
AR is an aperture ratio of the electric conducting pattern, and
α is a constant.

2. The electric conducting substrate of claim 1, wherein when a graph 1 representing Formula 1 and a graph 2 representing Formula 2 are illustrated by setting a characteristic length (Lc) of the cells as an X axis and setting a line width (W) of the electric conducting line as a Y axis, the line width (W) of the electric conducting line and the characteristic length (Lc) of the cells are comprised in a crossing region of a lower region of the graph 1 and a lower region of the graph 2.

3. The electric conducting substrate of claim 1, wherein the characteristic length (Lc) of the cells satisfies the following Formula 3:

$$Y_1/n \leq Lc \leq 2Y_2 \quad \text{[Formula 3]}$$

in Formula 3,
n is the number of subpixels arranged in one direction in each pixel of the display to which the electric conducting substrate is applied, and
$Y_1$ and $Y_2$ are represented by the following formulas, respectively, and $$Y_1=(2.9Q+68.1)\times 1 \ \mu m/1 \ inch$$

$$Y_2=(13.3Q+98.1)\times 1 \ \mu m/1 \ inch$$

in the formulas, Q is a diagonal length (inch) of an effective screen part of the display to which the electric conducting substrate is applied.

4. The electric conducting substrate of claim 1, wherein the characteristic length (Lc) of the cells satisfies the following Formula 4:

$$Lp/n \leq Lc \leq 2Lp \quad [\text{Formula 4}]$$

in Formula 4,
n is the number of subpixels arranged in one direction in each pixel of the display to which the electric conducting substrate is applied, and
Lp is a characteristic length of the pixel defined by a 0.5-squared value of an area of each pixel of the display to which the electric conducting substrate is applied.

5. The electric conducting substrate of any one of claim 1, wherein the characteristic length (Lc) of the cells satisfies the following Formula 5:

$$P_{pixel \ 1}/n \leq Lc \leq 2 P_{pixel \ 2} \quad [\text{Formula 5}]$$

in Formula 5,
n is the number of subpixels arranged in one direction in each pixel of the display to which the electric conducting substrate is applied, and
$P_{pixel \ 1}$ is a pitch of a short width of each pixel of the display to which the electric conducing substrate is applied, and $P_{pixel \ 2}$ is a pitch of a long width of each pixel of the display to which the electric conducting substrate is applied.

6. The electric conducting substrate of claim 1, wherein the line width (W) of the electric conducting line satisfies the following Formula 6:

$$0.03 \ Y_3 \geq W \quad [\text{Formula 6}]$$

in Formula 6,
W is a line width of the electric conducting line, and
$Y_3$ is a real number within a range of $Y_1 \leq Y_3 \leq Y_2$, and here, $Y_1$ and $Y_2$ are represented by the following formulas, respectively.

$$Y_1=(2.9Q+68.1)\times 1 \ \mu m/1 \ inch$$

$$Y_2=(13.3Q+98.1)\times 1 \ \mu m/1 \ inch$$

in the formulas, Q is a diagonal length (inch) of an effective screen part of the display to which the electric conducting substrate is applied.

7. The electric conducting substrate of claim 1, wherein the line width (W) of the electric conducting line satisfies the following Formula 7:

$$0.03 \ Lp \geq W \quad [\text{Formula 7}]$$

in Formula 7,
W is a line width of the electric conducting line, and
Lp is a characteristic length of the pixel defined by a 0.5-squared value of an area of each pixel of the display to which the electric conducting substrate is applied.

8. The electric conducting substrate of claim 1, wherein the line width (W) of the electric conducting line satisfies the following Formula 8:

$$0.03 \ P_{pixel} \geq W \quad [\text{Formula 8}]$$

in Formula 8,
W is a line width of the electric conducting line, and
$P_{pixel}$ is a pitch of each pixel of the display to which the electric conducting substrate is applied.

9. The electric conducting substrate of claim 1, wherein the line width (W) of the electric conducting line satisfies the following Formula 9:

$$3 \ Y_3/(100\times 10^{1/2}) \geq W \quad [\text{Formula 9}]$$

in Formula 9,
W is a line width of the electric conducting line, and
$Y_3$ is a real number (μm) within a range of $Y_1 \leq Y_3 \leq Y_2$, are represented by the following formulas, respectively:

$$Y_1=(2.9Q+68.1)\times 1 \ \mu m/1 \ inch$$

$$Y_2=(13.3Q+98.1)\times 1 \ \mu m/1 \ inch$$

in the formulas, Q is a diagonal length (inch) of an effective screen part of the display to which the electric conducting substrate is applied.

10. The electric conducting substrate of claim 1, wherein the line width (W) of the electric conducting line satisfies the following Formula 10:

$$3Lp/(100\times 10^{1/2}) \geq W \quad [\text{Formula 10}]$$

in Formula 10,
W is a line width of the electric conducting line, and
Lp is a characteristic length (μm) of the pixel defined by a 0.5-squared value of an area of each pixel of the display to which the electric conducting substrate is applied.

11. The electric conducting substrate of claim 1, wherein the line width (W) of the electric conducting line satisfies the following Formula 11:

$$3 \ P_{pixel}/(100\times 10^{1/2}) \geq W \quad [\text{Formula 11}]$$

in Formula 11,
W is a line width of the electric conducting line, and
$P_{pixel}$ is a pitch of each pixel of the display to which the electric conducting substrate is applied.

12. The electric conducting substrate of claim 1, wherein a visible line width ($W_v$) of the electric conducting line satisfies the following Formula 12 and is more than 0 to 3.6 μm or less:

$$W_v=W\times R_m \quad [\text{Formula 12}]$$

in Formula 12,
W is a line width of the electric conducting line, and
$R_m$ is reflectivity of an electric conducting line material configuring the electric conducting pattern.

13. The electric conducting substrate of claim 12, wherein bright room reflectivity of a display panel in an off mode of a display to which the electric conducting pattern is applied is 0.11 or less.

14. The electric conducting substrate of claim 12, wherein in the case of being indistinguishable by naked eyes, bright room reflectivity of a display panel with the electric conducting pattern in the display off mode is $b_1$ bright room reflectivity of only a display panel where the electric conducting pattern is not provided in the display off mode is $b_o$, and an absolute value of $[b_1/b_0-1]$ is 0.03 or less.

15. The electric conducting substrate of claim 12, wherein in the case of being indistinguishable by naked eyes, bright room reflectivity of a display panel with the electric conducting pattern in the display off mode is $b_1$ bright room reflectivity of only a display panel where the electric conducting pattern is not provided in the display off mode is $b_0$, and an absolute value of $[b_1/b_0-1]$ is 0.115 or less.

16. The electric conducting substrate of claim 1, wherein the electric conducting pattern comprises a regular pattern.

17. The electric conducting substrate of claim 1, wherein the electric conducting pattern comprises an irregular pattern.

18. The electric conducting substrate of claim 1, wherein the electric conducting pattern comprises a polygonal pattern having three angles or more.

19. The electric conducting substrate of claim 1, wherein the electric conducting pattern comprises an electric conducting line having a line width of 20 micrometers or less.

20. The electric conducting substrate of claim 1, wherein the electric conducting pattern comprises an electric conducting line having a line width of 0.5 to 10 micrometers.

21. The electric conducting substrate of claim 1, wherein an aperture ratio of the electric conducting pattern is 90% or more.

22. The electric conducting substrate of claim 1, wherein an aperture ratio of the electric conducting pattern is 95% or more.

23. The electric conducting substrate of claim 1, wherein the electric conducting pattern is made of metal.

24. The electric conducting substrate of claim 1, wherein the electric conducting pattern comprises a metal layer and a darkening layer provided on at least one side of the metal layer.

25. An electric conducting substrate, comprising:
a transparent substrate; and
an electric conducting pattern comprising an electric conducting line provided on the transparent substrate,
wherein the electric conducting pattern comprises cells closed by the electric conducting line,
a characteristic length (Lc) of the cells defined by a 0.5-squared value of an area of the cell satisfies the following Formula 3:

$$Y_1/n \leq Lc \leq 2Y_2 \qquad \text{[Formula 3]}$$

in Formula 3,
n is the number of subpixels arranged in one direction in each pixel of the display to which the electric conducting substrate is applied, and
$Y_1$ and $Y_2$ are represented by the following formulas, respectively.

$$Y_1=(2.9Q+68.1)\times 1\ \mu m/1\ inch$$

$$Y_2=(13.3Q+98.1)\times 1\ \mu m/1\ inch$$

in the formulas, Q is a diagonal length (inch) of an effective screen part of the display to which the electric conducting substrate is applied.

26. An electronic device comprising the electric conducting substrate of claim 1.

27. The electronic device of claim 26, further comprising:
a display pixel substrate provided on at least one side of the electric conducting substrate, wherein each pixel of the display pixel substrate comprises two or more subpixels.

28. The electronic device of claim 27, wherein each pixel of the display pixel substrate comprises three or four subpixels.

29. The electronic device of claim 26, wherein the electronic device is a touch panel, an organic light emitting diode illumination, or an organic solar cell.

30. A display device comprising the electric conducting substrate claim 1.

* * * * *